United States Patent [19]

Adkin

[11] Patent Number: 4,531,100
[45] Date of Patent: Jul. 23, 1985

[54] AMPLIFIER SUITABLE FOR LOW SUPPLY VOLTAGE OPERATION

[76] Inventor: Francis W. Adkin, 5 Cosway Mansions, Cosway St., London, N.W.1., England

[21] Appl. No.: 522,166
[22] PCT Filed: Nov. 10, 1982
[86] PCT No.: PCT/GB82/00321
§ 371 Date: Jul. 11, 1983
§ 102(e) Date: Jul. 11, 1983
[87] PCT Pub. No.: WO83/01714
PCT Pub. Date: May 11, 1983

[30] Foreign Application Priority Data
Nov. 10, 1981 [GB] United Kingdom .............. 8133807

[51] Int. Cl.$^3$ .............................................. H03F 3/04
[52] U.S. Cl. ................................... 330/290; 330/270; 330/288; 330/296
[58] Field of Search .............. 330/259, 265, 270, 276, 330/288, 290, 296

[56] References Cited

U.S. PATENT DOCUMENTS

| | | | |
|---|---|---|---|
| 2,979,666 | 4/1961 | Erath | 330/290 |
| 3,202,924 | 8/1965 | Myers et al. | 330/290 |
| 3,434,066 | 3/1969 | Huntley | 330/268 |
| 3,868,582 | 2/1975 | Haferl | 330/289 |
| 3,984,783 | 10/1976 | Bickley | 330/296 |
| 4,121,168 | 10/1978 | Stitt | 330/265 |
| 4,387,346 | 1/1983 | Fackler | 330/296 |

FOREIGN PATENT DOCUMENTS

| | | |
|---|---|---|
| 831496 | 3/1960 | United Kingdom . |
| 1044461 | 9/1966 | United Kingdom . |
| 1242248 | 8/1971 | United Kingdom . |
| 2073520 | 10/1981 | United Kingdom . |
| 2117591 | 10/1983 | United Kingdom . |

OTHER PUBLICATIONS

Murari et al., "A High-Power Hi-Fi Monolithic Amplifier", IEEE Transactions on Broadcast and Television Receivers, vol. B TR 20, No. 4, Sep. 17, 1974, pp. 311-320.

*Primary Examiner*—James B. Mullins
*Attorney, Agent, or Firm*—Laubscher & Laubscher

[57] ABSTRACT

An amplifier which is particularly suitable for low supply voltage operation and which is relatively insensitive to power supply voltage variations includes a signal amplifying stage (11) and a control stage (10). The signal amplifying stage (11) includes the output load (13), such as a loudspeaker, in series with a transistor (12) which is controlled by a current mirror circuit (14, 15, 16) in the control stage. The circuit acts by continuously comparing part of the voltage across the output load (13) with a very low reference voltage arising from the difference in the base-emitter voltages of two transistors (14, 15) operating at unequal collector current values. This causes voltage excursion peaks appearing at the junction of the output load (13) and the amplifying transistor (12) to be clamped to a voltage equal to or otherwise related to that at the opposite side of the output load (13).

6 Claims, 5 Drawing Figures

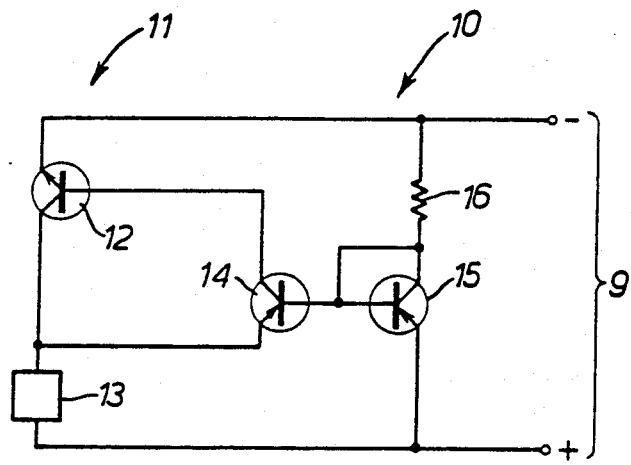
Fig.1.
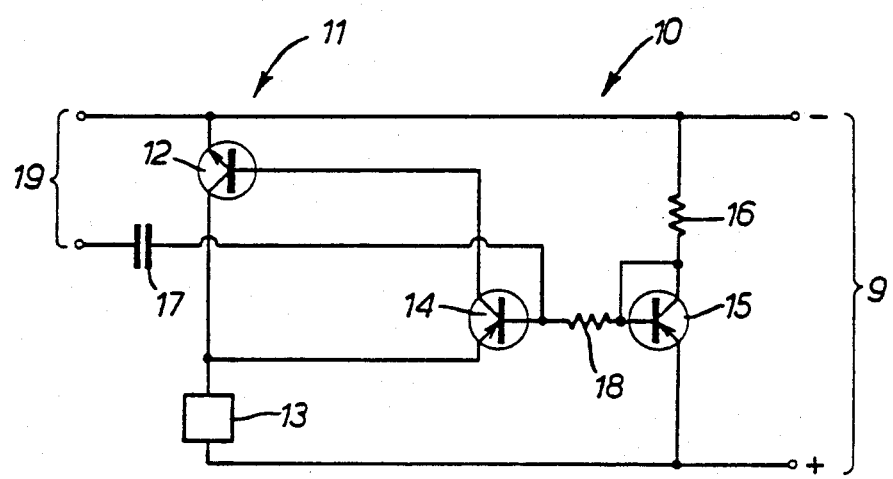
Fig.2.A

AMPLIFIER SUITABLE FOR LOW SUPPLY VOLTAGE OPERATION

BRIEF DESCRIPTION OF THE PRIOR ART

The present invention relates to an amplifier suitable for low supply voltage operation, and in particular to an amplifier of which the performance is consistent over a wide range of supply voltage.

Amplifiers in general, by virtue of the biassing arrangements chosen for their output amplifying elements, will not operate satisfactorily (or at all) under low supply voltage conditions. Furthermore, where an amplifier has been designed to operate at a specific supply voltage, often quite a small voltage drop from that specific value will upset the biassing arrangement and cause unsatisfactory operation of the amplifier. It is an object of the present invention to provide an amplifier which is relatively insensitive to such supply voltage variations.

SUMMARY OF THE INVENTION

Accordingly, the present invention provides an amplifier comprising a signal amplifying stage and a control stage for optimizing the D.C. current to the signal amplifying stage, the signal amplifying stage including a series combination of a semiconductor device and an output element which combination is arranged to be connected across a power source, the control stage acting to control D.C. current to the semiconductor device so as to clamp voltage excursion peaks appearing between the semiconductor device and the output element to a value equal to, or otherwise related to, that at the opposite side of the output element.

In general, the semiconductor device is a bipolar transistor of which the signal path is series-connected to a suitable output element or load such as a loudspeaker, earphone, or transformer for driving same. The amplifier may be single-ended or may use two such circuits in push-pull configuration.

Preferably, the D.C. current to the semiconductor device is controlled by the control stage by means of continuous comparison of the minimum instantaneous voltage across the output load with a very low reference voltage arising from the difference in the base-emitter voltages of two similar transistors operating at unequal collector current values, for example in the so-called "current mirror" configuration. The circuit performance is thus related to a difference voltage between two voltages which are both already stabilized to a first order. As a result, the effects of variations in supply voltage and in temperature are small.

When using silicon bipolar transistors, the circuit can operate from a supply voltage of which the lowest workable value, which varies slightly according on the application to which the amplifier is put, is generally in the range 0.85±0.1 volts D.C. The quiescent power computation (i.e. in the absence of input signal) is low; its magnitude naturally depends on the D.C. resistance of the output load but it can be of the order of 0.1 milliwatt for earphone output or of the order of 20 milliwatts for loudspeaker output. This aspect is clearly beneficial as regards battery operation, in particular in applications where there is little or no input signal for long periods of time, one such application being the so-called "baby alarm".

BRIEF DESCRIPTION OF THE DRAWINGS

In order that the present invention may be more readily understood, embodiments thereof will now be described by way of example, with reference to the accompanying drawings in which:

FIG. 1 shows one form of basic amplifier circuit in accordance with the invention, but omitting signal paths for clarity;

FIGS. 2A and 2B show the amplifier circuit of FIG. 1 including first and second possible signal path modes of connection, respectively;

DETAILED DESCRIPTION

Figure 2B:
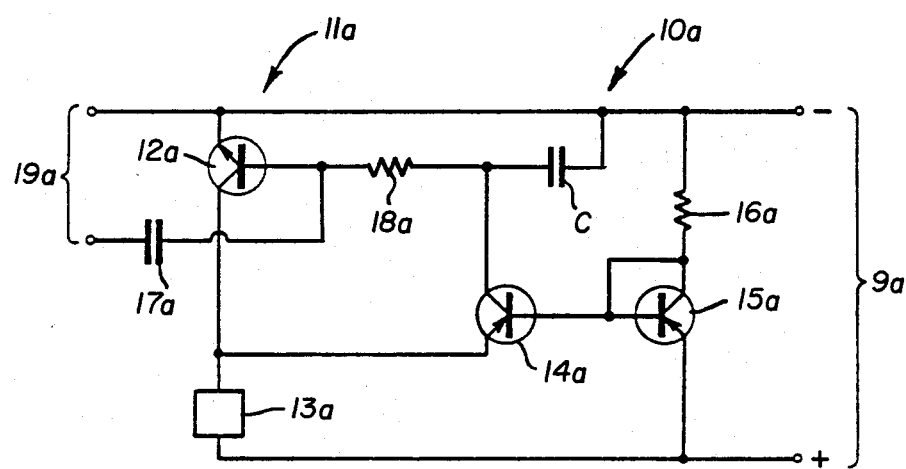

By reference to FIG. 1, the D.C. operation of the amplifier in the absence of signal is described. The amplifier includes control stage 10 and signal output amplifying stage 11 connected to D.C. voltage source 9. The latter is a conventional external power source such as a battery, having positive and negative terminals across which it presents a low impedance at signal frequencies. Signal output amplifying stage 11 includes transistor 12 of which the collector-emitter path is connected in series with output load 13 across power voltage source 9. Control stage 10 includes a current mirror circuit incorporating transistors 14, 15, having commoned bases, and resistor 16; the collector current of transistor 14 provides the base current for transistor 12 in the signal amplifying stage 11. The emitter of transistor 14 is connected between load 13 and the collector of transistor 12. Transistors 14 and 15 need to be of the same type and at the same temperature; the latter requirement can be met by mounting these two transistors close together or in a single heat-sink, or by common encapsulation or even integration. Although transistor 14 is part of the control stage, it can also be used for signal amplification, as will be described.

The mode of operation of the circuit of FIG. 1, which represents the D.C. state of an amplifier with zero input signal, is as follows. Resistor 16 value is chosen so that the current through transistor 15 exceeds that through transistor 14. The collector current of transistor 12 takes a value such that the voltage V across load 13 is given by the expression $V = V_{BE}(15) - V_{BE}(14)$, where $V_{BE}(15)$ and $V_{BE}(14)$ are the base-emitter voltages of transistors 15 and 14 respectively. The voltage V is small but not zero, simply because the current through transistor 15 has been set to exceed that through transistor 14, and there is therefore a finite difference in the base-emitter voltages. Thus transistor 12 is nearly, but not quite, cut-off, and the collector-emitter voltage of this transistor is almost equal to the supply voltage.

FIG. 2A shows the same D.C. configuration as FIG. 1 but additionally shows signal path connections. The additions comprise capacitor 17 between signal input 19 and the base of transistor 14, and resistor 18 between the bases of transistors 14 and 15, this resistor serving as a signal barrier. In the alternative mode of connection of FIG. 2B, the input signal is supplied, via the blocking capacitor 17a, to the base of transistor 12a instead of transistor 14, resistor 18a being moved to a position between transistor 12a base and transistor 14a collector, and a decoupling capacitor C being fitted between the collector of transistor 14a and whichever power supply rail is being used as signal ground. Thus the alternating signal input to the amplifier may be applied either at transistor 14 (as shown in FIG. 2A) or at transistor 12a in FIG. 2B. The former arrangement gives a higher value of signal gain because both of the transistors 14 and 12 contribute to the signal amplification. The latter arrangement has the advantage of providing flexibility in the circuit design characteristics regarding the D.C. biassing of transistor 12a, because control stage 10a in this arrangement is entirely outside the signal path and so can incorporate, for example, long time constants. Thus there is a choice of two alternative circuit arrangements, to suit different applications regarding such aspects as distortion limitations and economy of components. This specification relates to both arrangements except where otherwise stated.

In the circuit of FIG. 2 (including the above-mentioned alternative arrangement), the D.C. control function of stage 10 is actuated by output load signals into transistor 14 at its emitter; this transistor carries comparatively little D.C. collector current and may be regarded as almost cut-off, so that it virtually detects the positive swings in the output signals referred to here. It can be seen that the D.C. collector current of transistor 12 is regulated by transistor 14 so as to have the value which again gives rise to voltage V across load 13, where the value of V is given by the same expression as that relating to FIG. 1, with the qualification here that this voltage condition relates to the minimum instantaneous voltage across load 13, i.e. the load voltage at one signal peak. Since V is small, output positive peaks are always virtually at the positive supply voltage, i.e. transistor 12 virtually reaches cut-off at each such peak. This basic version of the circuit thus pre-supposes an output load sufficiently inductive to minimize peak distortion under such conditions. An earphone generally satisfies this requirement; a load which does not can still be used in the circuit without deterioration in the circuit performance so long as an inductor is added to the circuit in such a way that it is in parallel with the (non-inductive) load at signal frequencies. The circuit is also capable of feeding non-inductive loads without such added parallel inductors, with some reduction in output signal capability, and such an arrangement may be acceptable in some applications.

A useful effect arises if control stage 10 is amended by, for example, reducing its sensitivity to the D.C. control signals, or by adjusting the D.C. conditions of transistor 15; the output positive swings can thus be allowed to go beyond the positive supply rail and there is then a corresponding increase in maximum output signal level. Details of this minor circuit change are dependent on the particular use of the circuit and the amount of distortion which can be tolerated.

It can be seen that the collector current of transistor 12 (which constitutes almost all the circuit current under signal conditions) is continuously adjusted to take the smallest possible value consistent with no cut-off at signal peaks; and that it takes a very small value at times when the signal is zero.

Some approximate performance figures are given below. Clearly, these figures are slightly dependent on the current values at which the circuit is required to operate, and on the bottoming and other characteristics of the particular transistors used; also on the amount of distortion which can be tolerated in the particular application.

The lowest supply voltage $V_q$ (Min) from which the circuit is capable of operation (for silicon transistors) is given, where $V_{BE}$ (12) is the base-emitter voltage of transistor 12 and $V_{6E}$ (14) is the collector-emitter voltage of transistor 14 when bottomed at low current, by:

$$V_q(\text{Min}) = V_{BE}(12) + (V_{CE}(14) + V$$
$$= (\text{typically}) \ 0.55\text{v} + 0.25\text{v} + 0.05\text{v}$$
$$= 0.85\text{v}$$

This figure of 0.85 volts may vary by ±0.1 volts with different uses of the circuit, for the reasons outlined above.

The maximum output signal voltage $V_o$ (Max) obtainable with a particular value of supply voltage $V_q$ is given, as a peak-to-peak value, where ($V_{6E}$ (12) is the collector-emitter voltage of transistor 12 bottomed at high current, by:

$$V_o(\text{Max}) = V_q - V - V_{CE}(12)$$
$$= (\text{typically}) \ V - 0.05\text{v} - 0.65\text{v}$$
$$= V_q - 0.7\text{v}$$

Any figure obtained for $V_o$ (Max) from this generalized formula is an approximation, for the reasons outlined above.

Figure 3:
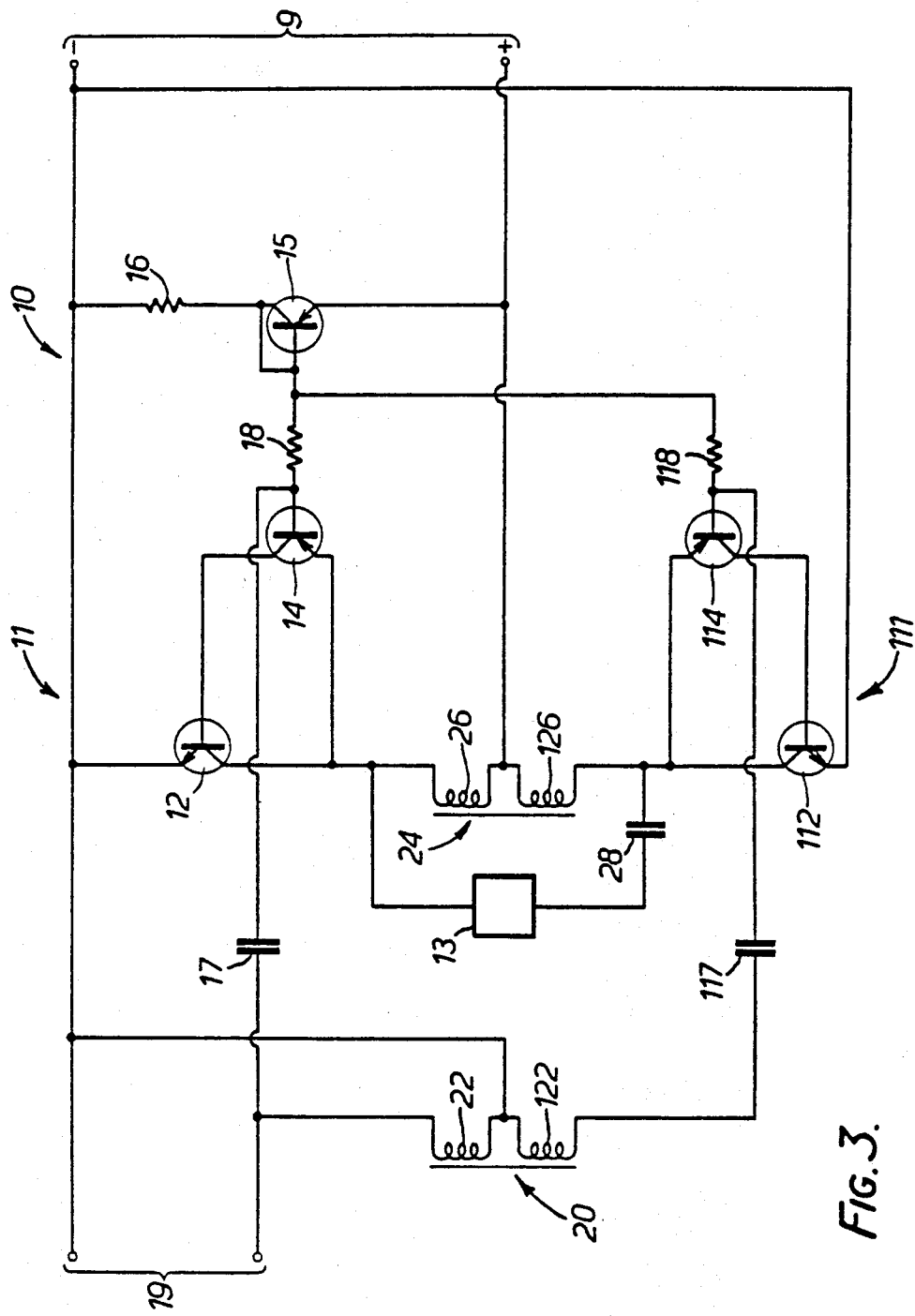
FIG. 3 shows a form of amplifier circuit arranged to operate in push-pull.

FIG. 3 shows another circuit, similar to that described above but in push-pull configuration. It includes the amplifier arrangement shown in FIG. 2, with a single transistor 15 and associated components and connections but otherwise duplicated for push-pull purposes. The phase-splitting transformer 20 has windings 22, 122 between signal input 19 and capacitors 17,117; the phase-recombining output transformer 24 has windings 26, 126 connected across the output load 13, which can be non-inductive without deterioration in the circuit performance provided transformer 24 is itself sufficiently inductive. Capacitor 28 is connected in series with the load to prevent D.C. commoning of the collectors of transistors 12 and 112 via the load.

The circuit shown in FIG. 3 can be modified as discussed in relation to FIG. 2 by feeding the input signal from each of the input transformer windings 22,122 to the bases of transistors 12,112 respectively; the location of resistors 18,118 is altered as discussed above, and two extra capacitors are included for signal decoupling purposes.

Operation of the circuit of FIG. 3 is similar to that described in relation to FIG. 2, apart from the push-pull aspects referred to above. The performance figures are as follows; the lowest supply voltage $V_q$(Min) from which the circuit is capable of operation is as for FIG. 2, i.e. 0.85±0.1 volts, and the maximum output signal voltage $V_o$(Max) is twice that for FIG. 2, i.e. 2×($V_q$−0.7 v), for example the values shown below.

$V_o$(Max) = 0.3v peak-to-peak when $V_q$ = 0.85v D.C.
    0.6v                       1.0v
    1.6v                       1.5v
    2.6v                       2.0v
etc.

Small variations may arise in performance figures as previously indicated with reference to FIG. 2.

Figure 4:
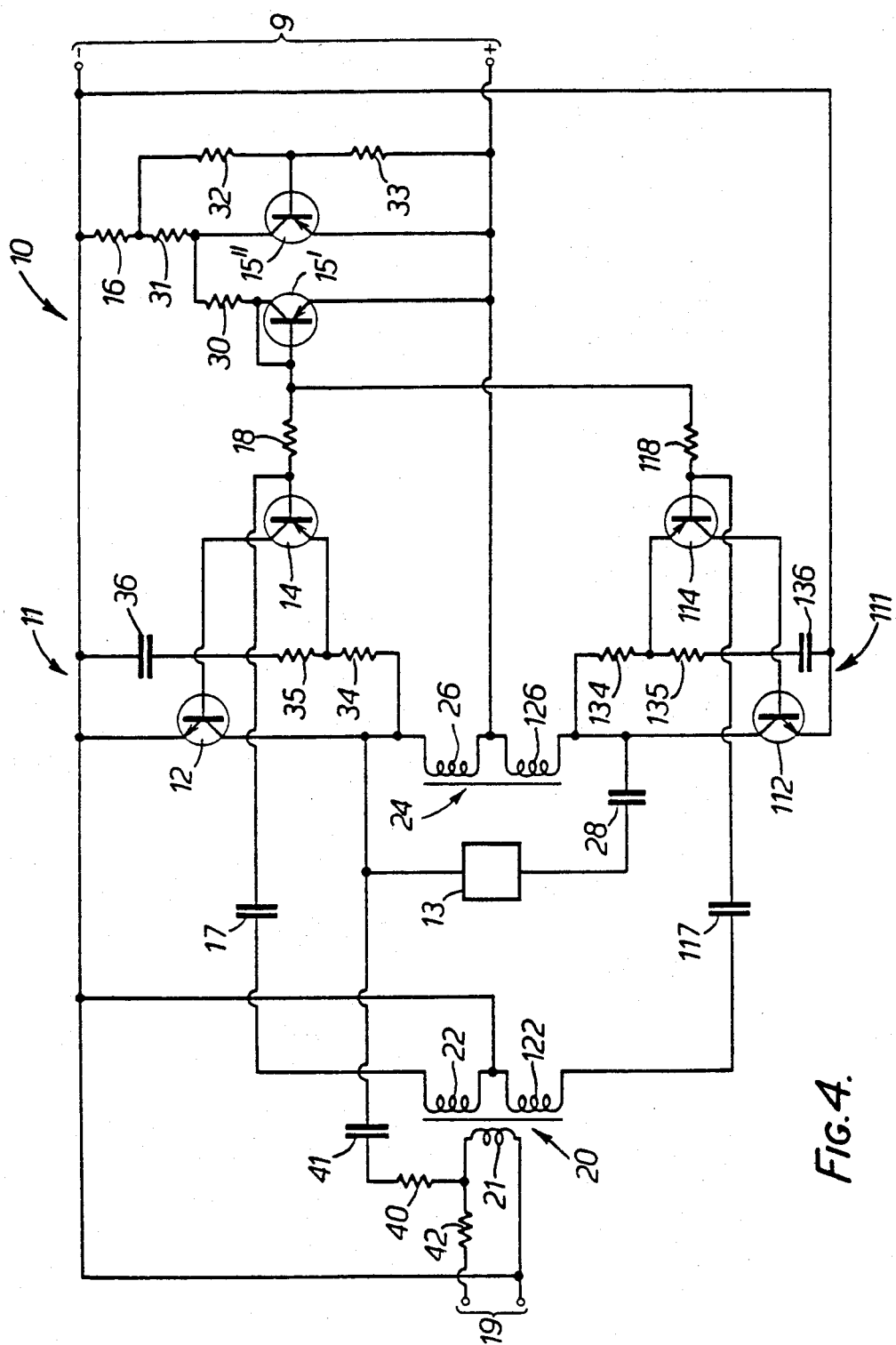
FIG. 4 shows a developed form of amplifier circuit including further features.

FIG. 4 shows a developed circuit based on that of FIG. 3 but incorporating a number of refinements which will now be discussed.

The circuits previously described have a very consistent signal-handling capacity over a wide range of supply voltages. This consistency is extended to include improved regulation of D.C. current in quiescent conditions by replacing transistor 15 by the arrangement shown in FIG. 4, i.e. the network of transistors 15',15" and resistors 30,31, 32,33. This arrangement provides, at the base and collector of transistor 15', a D.C. voltage with controlled stabilization against supply voltage variations. The arrangement achieves this by supplying transistor 15' from a D.C. voltage which is already stabilized to a first order by transistor 15". Also, the stabilization effected by the transistor 15" stage is improved by incorporating the low value resistor 31 which effectively introduces a negative voltage co-efficient to compensate the remaining small positive voltage co-efficient at the junction of resistors 16,31,32, these co-efficients referring to voltage variations when the supply voltage 9 varies. The result of this is that the quiescent current drawn by the circuit is maintained largely constant, instead of exhibiting the small increase which occurs in the previous circuits, as the supply voltage is increased.

The signal amplifying element between transistor 14 base and transistor 12 collector in previous circuits (excluding arrangements described above as alternative with reference to FIG. 2B) gives current amplification but not voltage amplification. Voltage amplification is provided by incorporating additional passive components as shown in FIG. 4. Associated with transistor 14 (and similarly with transistor 114) resistor 34 is included in the path between load 13 and the emitter of transistor 14; also a series combination of resistor 35 and capacitor 36 is included between the emitter of transistor 14 and the negative rail of supply 12. This arrangement achieves voltage amplification by amending the A.C. negative feedback whilst maintaining the D.C. control paths. Capacitor 36 is a D.C. blocking capacitor and should be of such a value that its impedance is much less than that of resistors 35 and 36 at signal frequencies. The voltage gain of the signal amplifying element under consideration is $(R(34)+R(35))/R(35)$ to a first approximation, where R(34) and R(35) are the values of resistors 34 and 35.

Overall negative feedback, such as is generally provided to reduce the effects of, for example, performance limitations of individual components, is added in FIG. 4 by the provision of resistor 40 and capacitor 41, connected in series between lead 13 and primary winding 21 of input transformer 20. The alternating signal input to the circuit is applied via resistor 42 and primary winding 21 of input transformer 20. The windings of transformer 20 are chosen to provide a step-up ratio in order to achieve the overall signal gain necessary in a negative voltage feedback circuit. The feedback is controlled by resistors 40 and 42 in the normal way. Capacitor 41 is a D.C. blocking capacitor and should be of such a value that its impedance is much less than that of resistors 40 and 42 at signal frequencies.

I claim:

1. In an amplifier system including a direct-current voltage source (9), an output load element (13), a signal output amplifying stage (11) including a first transistor (12) having a pair of load circuit electrodes connected in series with said output load element to define a series path connected across said voltage source, and a control stage (10) for controlling the operation of said signal amplifying stage;

the improvement wherein said control stage comprises clamping means (14, 15) for controlling the D.C. current through said series path in dependence on the voltage across the output load element, thereby to clamp the voltage excursion peaks of one polarity which appear between said first transistor and said output load element to a voltage related to that at the opposite side of the output load element, whereby the amplifier system is operable for a minimum supply voltage at about 0.85 volts, said clamping means including
   (a) a second transistor (14) having a main current path connected at one end with said series path between said first transistor and said output load element, the other end of said main current path being connected with the control electrode of said first transistor; and
   (b) means (15) for controlling the direct-current bias of the control electrode of said second transistor in dependence on the voltage across the output load element.

2. In an amplifier system including a direct-current voltage source (9), an output load element (13), a signal output amplifying stage (11) including a first transistor (12) having a pair of load circuit electrodes connected in series with said output load element to define a series path connected across said voltage source, and a control stage (10) for controlling the operation of said signal amplifying stage;

the improvement wherein said control stage comprises clamping means (14,15) for controlling the D.C. current through said series path in dependence on the voltage across the output load element, thereby to clamp the voltage excursion peaks of one polarity which appear between said first transistor and said output load element to a voltage related to that at the opposite side of the output load element, said clamping means including
   (a) a second transistor (14) having a main current path connected at one end with said series path between said first transistor and said output load element, the other end of said main current path being connected with the control electrode of said first transistor;
   (b) a third transistor (15) having a main current path connected across said power supply to define a reference voltage;
   (c) means connecting the control electrodes of said second and third transistors; and
   (d) means (16) causing the current in said third transistor to exceed that in said second transistor, whereby with zero input signal to the amplifier stage, the first transistor is almost in a cut-off condition.

3. Apparatus as defined in claim 2, wherein said control stage further includes
   (e) stabilizing means for stabilizing said third transistor against variations in the D.C. supply voltage, including
      (1) a fourth transistor (15") having a main current path connected across said third transistor, and
      (2) means (30-33) for applying a negative voltage coefficient to the control electrode of said fourth transistor, thereby to compensate for the positive voltage coefficient in said third transistor.

4. Apparatus as defined in claim 2, said further including means (17, 19) for applying the input signal to said amplifier system to the control electrode of said second transistor.

5. Apparatus as defined in claim 2, and further including means (17, 19) for applying the input signal to said amplifier system to the control electrode of said first transistor.

6. Apparatus as defined in claim 2, and further including fifth (112) and sixth (114) transistors corresponding with said first and second transistors, respectively, and means (24) connecting said fifth and sixth transistors in push-pull relation with said first and second transistors.

* * * * *